(12) United States Patent
Ring

(10) Patent No.: US 6,946,739 B2
(45) Date of Patent: Sep. 20, 2005

(54) LAYERED SEMICONDUCTOR DEVICES WITH CONDUCTIVE VIAS

(75) Inventor: Zoltan Ring, Durham, NC (US)

(73) Assignee: Cree, Inc., Durham, NC (US)

( * ) Notice: Subject to any disclaimer, the term of this patent is extended or adjusted under 35 U.S.C. 154(b) by 34 days.

(21) Appl. No.: 10/249,448

(22) Filed: Apr. 10, 2003

(65) Prior Publication Data

US 2004/0241970 A1 Dec. 2, 2004

Related U.S. Application Data

(63) Continuation of application No. 10/007,431, filed on Nov. 8, 2001, now Pat. No. 6,649,497, which is a continuation of application No. 09/546,821, filed on Apr. 11, 2000, now Pat. No. 6,475,889.

(51) Int. Cl.[7] .................... H01L 23/48; H01L 23/52; H01L 29/40
(52) U.S. Cl. ............................ 257/774; 257/77
(58) Field of Search ..................... 257/77, 774

(56) References Cited

U.S. PATENT DOCUMENTS

| | | | |
|---|---|---|---|
| 4,771,017 A | 9/1988 | Tobin et al. | |
| 4,866,507 A | 9/1989 | Jacobs et al. | |
| 4,874,500 A | 10/1989 | Madou et al. | |
| 4,951,014 A | 8/1990 | Wohlert et al. | |
| 4,966,862 A | 10/1990 | Edmond | |
| 5,185,292 A | 2/1993 | VanVonno et al. | |

(Continued)

FOREIGN PATENT DOCUMENTS

| | | |
|---|---|---|
| EP | 0663693 A | 7/1995 |
| EP | 0887854 A1 | 12/1998 |
| JP | 410229074 A | 6/1998 |

OTHER PUBLICATIONS

Ralph E. Williams, Gallium Arsenide Processing Techniques, 1984, pp. 346–351, Artech House, Inc., Dedham, MA.

J. J. Wang, et al., Low Bias Dry Etching of SiC and SiCN in ICP NF3 Discharges, Mat Ros. Soc. Symp. Proc., 1998, vol. 512, Materials Research Society.

J. R. Flemish and K. Xie, Profile and Morphology Control during Etching of SiC Using Electron Cyclotron Resonant Plasamas, J. Electrochem Soc., Aug. 1996, pp. 2620–2623, vol. 143, No. 8, The Electrochom Society, Inc.

G. McDaniel, et al., Comparison of dry etch chemistries for SiC, J. Vac. Sci. Technol., May/Jun. 1997, pp. 885–889, A 15(3), American Vacuum Society.

J. J. Wang, et al., Low Damage, Highly Anisotropic Dry Etching of SiC, IEEE, 1998, pp. 10–14.

J. J. Wang, et al., Inductively coupled plasma etching of bulk 6H–SiC and thin–film SiCN in NF3 chemistries, J. Vac. Sci. Technol., Jul./Aug. 1998, pp. 2204–2209, A 16(4).

(Continued)

*Primary Examiner*—Howard Weiss
(74) *Attorney, Agent, or Firm*—Summa & Allan, P.A.

(57) ABSTRACT

A method of fabricating an integrated circuit on a silicon carbide substrate is disclosed that eliminates wire bonding that can otherwise cause undesired inductance. The method includes fabricating a semiconductor device on a first surface of a silicon carbide substrate and with at least one metal contact for the device on the first surface of the substrate. The opposite, second surface of the substrate is then ground and polished until it is substantially transparent. The method then includes masking the polished second surface of the silicon carbide substrate to define a predetermined location for a via that is opposite the device metal contact on the first surface; etching the desired via through the desired masked location until the etch reaches the metal contact on the first surface; and metallizing the via to provide an electrical contact from the second surface of the substrate to the metal contact and to the device on the first surface of the substrate.

13 Claims, 4 Drawing Sheets

U.S. PATENT DOCUMENTS

| | | | |
|---|---|---|---|
| 5,187,547 A | | 2/1993 | Niina et al. |
| 5,264,713 A | | 11/1993 | Palmour |
| 5,279,888 A | | 1/1994 | Nii |
| 5,343,071 A | | 8/1994 | Kazior et al. |
| 5,406,122 A | | 4/1995 | Wong et al. |
| 5,449,953 A | | 9/1995 | Nathanson et al. |
| 5,539,217 A | | 7/1996 | Edmond et al. |
| 5,662,770 A | | 9/1997 | Donohoe |
| 5,672,546 A | | 9/1997 | Wojnarowski |
| 5,807,783 A | | 9/1998 | Gaul et al. |
| 5,914,508 A | | 6/1999 | Varmazis et al. |
| 5,935,733 A | | 8/1999 | Scott et al. |
| 5,939,732 A | | 8/1999 | Kurtz et al. |
| 5,963,818 A | | 10/1999 | Kao et al. |
| 6,020,600 A | | 2/2000 | Miyajima et al. |
| 6,087,719 A | * | 7/2000 | Tsunashima ............... 257/686 |
| 6,114,768 A | | 9/2000 | Gaul et al. |
| 6,128,363 A | | 10/2000 | Shoki et al. |
| 6,221,537 B1 | | 4/2001 | Thompson et al. |
| 6,225,651 B1 | * | 5/2001 | Billon ............... 257/200 |
| 6,297,100 B1 | | 10/2001 | Kumar et al. |
| 6,316,826 B1 | | 11/2001 | Yamamoto et al. |
| 6,515,303 B2 | * | 2/2003 | Ring ............... 257/77 |

OTHER PUBLICATIONS

Lihui Cao, et al., Etching of SiC Using Inductively Coupled Plasma, J. Electrochem Soc., Oct. 1998, pp. 3609–3612, vol. 145, No. 10, The Electrochemical Society, Inc.

J. Hong, et al., Plasma Chemistries for High Density Plasma Etching of SiC, Journal of Electronic Materials, 1999, pp. 196–201, vol. 28, No. 3.

P. Leerungnawarat, et al., Via–hole etching for SiC, J. Vac. Sci. Technol., Sep./Oct. 1999, pp. 2050–2054, B 17(5), American Vacuum Society.

Cho, et al.; High density plasma via holo etching in SiC: 47th International Symposium of the American Vaccum Society, Boston, MA, vol. 19, No. 4, pt. 1–2, pp. 1878–1881; J. Vac. Sci. Technol., Jul.–Aug. 2001, AIP for American Vacuum Soc., USA.

P. Chabert, et al.; High rate etching of 4H–SiC using a SF/sub 6//0/sub2/holicon plasma; Applied Physics Lotters, Apr. 17, 2000, AIP, USA, vol. 76, No. 16, pp. 2310–2312.

* cited by examiner

LAYERED SEMICONDUCTOR DEVICES WITH CONDUCTIVE VIAS

CROSS REFERENCE TO RELATED APPLICATIONS

This application is a continuation of Ser. No. 10/007,431 filed Nov. 8, 2001, now U.S. Pat. No. 6,649,497, which is a continuation of Ser. No. 09/546,821 filed Apr. 11, 2000 now U.S. Pat. No. 6,475,889.

BACKGROUND OF INVENTION

[FEDERAL ASSISTANCE]

This invention was developed under DARPA Contract No. F33615-96-C-1967. The government may have certain rights in this invention.

The present invention relates to integrated circuits formed in semiconductor materials and in particular relates to methods for forming via openings in semiconductor substrates and the resulting structures. More particularly, the invention relates to the use of such vias to form monolithic microwave integrated circuits (MMICs) in silicon carbide (SiC).

The present invention relates to the manufacture of via openings ("vias") in integrated circuits (ICs), and in particular relates to a method of forming such vias in silicon carbide in order to take advantage of silicon carbide's electronic, thermal, and mechanical properties in the manufacture and use of monolithic microwave integrated circuits. MMICs.

In its most basic sense, a monolithic microwave integrated circuit is an integrated circuit; i.e., a circuit formed up a plurality of devices; in which all of the circuit components are manufactured on top of a single semiconductor substrate, and which is designed to operate at microwave frequencies. As is generally the case with integrated circuits, the advantage of placing the device and circuit components on a single substrate is one of saving space. Smaller circuit size offers numerous advantages for electronic circuits and the end-use devices that incorporate such circuits. In general, the end use devices can be smaller while offering a given set of functions, or more circuits and functions can be added to devices of particular sizes, or both advantages can be combined as desired. From an electronic standpoint, integrated circuits help reduce or eliminate problems such as parasitic capacitance loss that can arise when discrete devices are wire-bonded to one another to form circuits. These advantages can help integrated circuits operate at improved bandwidths as compared to circuits that are "wired" together from discrete components.

Wireless communications systems represent one area of recent and rapid growth in integrated circuits and related commercial technology. Such systems are exemplified, although not limited to, cellular radio communication systems. One estimate predicts that the number of wireless subscribers for such phones will continue to grow worldwide and will exceed 450 million users in the immediate future. The growth of such technologies will require that devices are smaller, more powerful and easier to manufacture. These desired advantages apply to base, relay and switching stations as well as to end user devices such as the cellular phones themselves.

As recognized by those of ordinary skill in this art, many wireless devices, and in particular cellular phone systems, operate in the microwave frequencies of the electromagnetic spectrum. Although the term "microwave" is somewhat arbitrary, and the boundaries between various classifications or frequencies are likewise arbitrary, an exemplary choice for the microwave frequencies would include wavelengths of between about 3,000 and 300,000 microns ($\mu$), which corresponds to frequencies of between about 1 and 100 gigahertz (GHz).

As further known by those of ordinary skill in this art, these particular frequencies are most conveniently produced or supported by certain semiconductor materials. For example, although discrete (i.e., individual) silicon (Si) based devices can operate at microwave frequencies, silicon-based integrated circuits suffer from lower electron mobility and are generally disfavored for frequencies above about 3–4 Ghz. Silicon's inherent conductivity also limits the gain that can be delivered at high frequencies.

Accordingly, devices that operate successfully on a commercial basis in the microwave frequencies are preferably formed of other materials, of which gallium arsenide (GaAs) is presently a material of choice. Gallium arsenide offers certain advantages for microwave circuits and monolithic microwave integrated circuits, including a higher electron mobility than silicon and a greater insulating quality.

Because of the frequency requirements for microwave devices and microwave communications, silicon carbide is a favorable candidate material for such devices and circuits. Silicon carbide offers a number of advantages for all types of electronic devices, and offers particular advantages for microwave frequency devices and monolithic microwave integrated circuits. Silicon carbide has an extremely wide band gap (e.g., 2.996 electron volts (eV) for alpha SiC at 300K as compared to 1.12 eV for Si and 1.42 for GaAs), has a high electron mobility, is physically very hard, and has outstanding thermal stability, particularly as compared to other semiconductor materials. For example, silicon has a melting point of 1415° C. (GaAs is 1238° C.), while silicon carbide typically will not begin to disassociate in significant amounts until temperatures reach at least about 2000° C. As another factor, silicon carbide can be fashioned either as a semiconducting material or a semi-insulating material. Because insulating or semi-insulating substrates are often required for MMICs, this is a particularly advantageous aspect of silicon carbide.

MMICs are fabricated with backside metallic ground planes, to which contacts must be made from various points in the MMIC, for example at transmission line terminations. Traditionally, this has been accomplished by wire bonds. Although wire bonding techniques can be used for other devices that operate at other frequencies, they are disadvantageous at microwave frequencies in silicon carbide devices. In particular, wires tend to cause undesired inductance at the microwave frequencies at which silicon carbide devices are capable of operating. For frequencies above 10 GHz, wire bonding simply must be avoided altogether. Accordingly, such wire bonding is desirably and sometimes necessarily avoided in silicon carbide-based MMICs.

The use of conductive vias (i.e., via openings filled or coated with metal) to replace wire bonds is a potential solution to this problem. To date, however, opening vias in silicon carbide has been rather difficult because of its extremely robust physical characteristics, which, as noted above, are generally advantageous for most other purposes.

ETCHING AND ETCHANTS

Etching is a process that removes material (e.g., a thin film on a substrate or the substrate itself) by chemical or physical reaction or both. There are two main categories of etching: wet and dry. In wet etching, chemical solutions are used to etch, dry etching uses a plasma. Silicon carbide does not lend itself rapidly to wet etching because of SiC's stability and high bond strength. Consequently, dry etching is most often used to etch silicon carbide.

In dry etching, a plasma discharge is created by transferring energy (typically electromagnetic radiation in the RF or microwave frequencies) into a low-pressure gas. The gas is selected so that its plasma-state etches the substrate material. Various fluorine-containing compounds (e.g., $CF_4$, $SF_6$, $C_4F_8$) are typically used to etch silicon carbide and different plasma reactor systems may also use gas additives such as oxygen ($O_2$), hydrogen ($H_2$), or argon (Ar). The plasma contains gas molecules and their dissociated fragments: electrons, ions, and neutral radicals. The neutral radicals play a part in etching by chemically reacting with the material to be removed while the positive ions traveling towards a negatively charged substrate assist the etching by physical bombardment.

Reactive ion etching (RIE) systems typically use one RF generator. The RF power is fed into one electrode (the "chuck," on which the wafers are placed), and a discharge results between this electrode and the grounded electrode. In such systems, the capacitive nature of RF energy coupling limits the density of the plasma, which in turn leads to lower etch rates of silicon carbide. In RIE systems, plasma density and ion energy are coupled and cannot be independently controlled. When RF input power increases, plasma density and ion energy both increase. As a result, RIE systems cannot produce the type of high density and low energy plasma favorable for etching vias in silicon carbide.

In inductively coupled plasma (ICP) systems, two RF generators are used. One feeds RF power to a coil wrapped around the non-conductive discharge chamber. The second feeds power to the electrode (chuck) on which the wafers are placed. In such systems, the inductive nature of the RF energy coupling increases the efficiency of energy coupling and hence the density of the plasma. Additionally, the plasma density can be independently controlled by the coil RF power, while the ion energy can be independently controlled by the chuck RF power. Thus, ICP systems can produce the high density and low energy plasmas that are favorable for etching vias in silicon carbide.

Etches are performed on selected areas of the wafer by masking areas of the wafer that do not need to be etched. The ratio of the etch rate of the substrate (the material to be etched) to the etch rate of the mask material is referred to as the "selectivity" of the etch. For deep etches and faithful pattern transfer, high selectivity etches are desired.

Etches generally proceed in both the vertical and horizontal directions. The vertical direction can be measured as etch depth in the unmasked areas, while the horizontal direction can be measured as undercut under the mask areas. The degree of anisotropy is expressed by how much the ratio of the horizontal etch rate to the vertical etch rate deviates from unity. When the etch rate in the vertical direction is much greater than the rate in the horizontal direction, the etch is called anisotropic. The reverse characteristic is referred to as being isotropic. Because of silicon carbide's high bond strength, it does not etch without ion bombardment in the horizontal direction. As a result, dry etches of silicon carbide are generally anisotropic.

In contrast, etches of silicon (Si) in ICP systems are generally isotropic. This results from silicon's low bond strength, because of which it readily etches in the horizontal direction. Silicon etches can be made anisotropic by using the Bosch process that alternates a deposition step for sidewall protection and an etch step.

The use of ICP (inductively coupled plasma) and ECR (electron cyclotron resonance) sources for SiC etching have resulted in higher etch rates as compared to RIE (reactive ion etch). Both ICP and ECR systems use lower operating pressure (e.g., 1 to 20 milliTorr), higher plasma density ($10^{11}$ to $10^{12}$ cm$^{-3}$) and lower ion energies compared to RIE systems. The combination of these parameters result in high etch rate of SiC and minimal erosion of the etch mask. RIE systems use higher pressure (10 to 300 milliTorr) lower plasma density ($10^{10}$ cm$^{-3}$) and higher ion energies to break SiC bonds and etch; however, the detrimental effects of high ion energies and low plasma density include mask erosion and lower etch rate.

As reported in the scientific literature by McDaniel et al., *Comparison of Dry Etch Chemistries for SiC*, J. Vac. Sci. Technol. A., 15(3), 885 (1997), scientists have been successful in etching SiC using an electron cyclotron resonance (ECR) plasma. Scientific studies have determined that higher ion density ECR discharges of $CF_4/O_2$ or $SF_6/O_2$ results in a much higher etch rate than RIE. In contrast with RIE, there have been no observed benefits to adding oxygen to either $NF_3$ or $SF_6$ during ECR etching.

Previous attempts at using plasma chemistries for high-density plasma etching of SiC include the use of chlorine ($Cl_2$), bromine ($Br_2$), or iodine ($I_2$)-based gases. However, the use of fluorine-based gas has produced much higher etch rates. For example, Hong et al., *Plasma Chemistries for High Density Plasma Etching of SiC*, J. Electronic Materials, Vol. 28, No. 3, 196 (1999), discusses dry etching of 6H—SiC using a variety of plasma chemistries which include sulfur hexafluoride ($SF_6$), chlorine ($Cl_2$), iodine chloride (ICl), and iodine bromide (IBr) in high ion density plasma tools (i.e., ECR and ICP). These efforts have achieved etch rates of around 0.45 $\mu$m/minute (4500 Å/minute) with $SF_6$ plasmas. Alternatively, $Cl_2$, ICl, and IBr-based chemistries in ECR and ICP sources resulted in lower rates of 0.08 $\mu$m/minute (800 Å/minute). It was found that fluorine-based plasma chemistries produced the most rapid, and hence most desirable, etch rates for SiC under high-density plasma conditions. Unfortunately, the fluorine-based chemistries displayed a poor selectivity for SiC with respect to photoresist masks.

Wang et al. reported in *Inductively Coupled Plasma Etching of Bulk 6H—SiC and Thin-film SiCN in NF3 Chemistries*, J. Vac. Sci. Technol. A, 16(4) (1998) the etching characteristics of 6H p+ and n+ SiC and thin-film $SiC_{0.5}N_{0.5}$ in inductively coupled plasma $NF_3/O_2$ and $NF_3/Ar$ discharges wherein etch rates of 0.35 $\mu$/minute (3,500 Å/minute) were achieved.

In further scientific literature, Cao et al., *Etching of SiC Using Inductively Coupled Plasma*, J. Electrochem. Soc., Vol. 145, No. 10 (1998) discusses plasma etching in an ECR plasma using $CF_4$ and $O_2$ gas at flow rates of 20 standard cubic centimeters per minute (sccm) and 9 sccm, respectively, attained an etch rate in SiC of about 0.05 $\mu$m/minute (500 Å/minute). The process resulted in a 14 $\mu$m deep trench having a smooth bottom surface. Further, the low chamber pressure (i.e., 7 mTorr) minimized micromasking effects during the deep etch trenching. During the Cao et al. investigation, substrate bias was maintained at 10 V and the coil power was maintained at 700 W.

In view of the technologies discussed above, a primary objective of SiC via etching is finding a process in which SiC is etched at a reasonable rate while erosion of the etch mask is kept to a minimum. The factors affecting this objective are the choice of mask material, plasma chemistry, plasma density, and ion energy. A secondary objective when etching vias in SiC is obtaining smooth etch surfaces.

Therefore there is a need for a process in which SiC may be etched at a reasonably rapid rate while erosion of the etch mask is minimized.

There is also a need for a method for etching a via in SiC of sufficient depth and at a reasonable rate which results in a smooth surface at the bottom of the via trench.

A further need exists for a technique that successfully incorporates the use of appropriate vias in semi-conducting silicon carbide substrates to facilitate the manufacture of silicon carbide based MMICS and the end use devices that can be formed with the silicon carbide-based MMICS.

SUMMARY OF INVENTION

Therefore, it is an object of the present invention to provide a method of etching vias in and entirely through silicon carbide substrates, in a manner which favorably differentiates between the silicon carbide be etched and the masking material.

The invention meets this object with a method of etching a via on a silicon carbide substrate that has first and second surfaces on opposite sides of the substrate. The method comprises placing a conductive etch stop material at a predetermined position on a first surface of a silicon carbide substrate, masking the second surface of the silicon carbide substrate to define a predetermined location for a via that is opposite from the predetermined position for the conductive etch stop material, etching a via in the substrate from the masked second surface until the etched via reaches entirely through the substrate to the conductive etch stop material, and connecting the conductive etch stop material on the first surface of the substrate to the second surface of the substrate.

In another aspect, the invention comprises the method of fabricating integrated circuits on silicon carbide substrates while reducing the need for wire bonding that can otherwise cause undesired inductance at high frequencies.

In another aspect, the invention comprises a circuit precursor comprising a silicon carbide substrate having respective first and second surfaces, a via extending entirely through the silicon carbide substrate, and a conductive contact through the via connecting the front and back surfaces of the silicon carbide substrate.

In yet another aspect, the invention is a Monolithic Microwave Integrated Circuit (MMIC) comprising a semi-insulating silicon carbide substrate having respective opposite first and second surfaces, a microwave circuit formed on the first surface of the substrate, the circuit including a plurality of conductive contacts on the first surface, a plurality of vias extending entirely through the substrate with each of the vias terminating at one of the conductive contacts, and a conductor in each via for forming a complete electrical pathway between the first and second surfaces of the silicon carbide substrate.

These and other objects and advantages of the invention, and the manner in which the same are accomplished, will be more fully understood when taken in conjunction with the detailed description and drawings in which:

DETAILED DESCRIPTION

In a first aspect, the invention is a method of forming vias in a particular material silicon carbide that enables integrated circuits, and particularly monolithic microwave integrated circuits, to be formed in silicon carbide substrates in a manner that reduces the inductance problems that are characteristic of such MMICS when wire bonding is used to form electrical contacts for high frequency devices and circuits.

FIGS. 1 through 11 illustrate in sequential fashion the basic steps of the method aspects of the present invention. These will be described somewhat generally, following which particular experimental details will be set forth. Because much of the background of MMICs and their function is well understood in this art, these will not be described in particular detail other than as necessary to highlight the invention. In the same manner, certain process steps are generally well understood so that where appropriate, these will be simply named rather than described in detail. The novel and non-obvious features of the invention, however, are set forth herein in sufficient detail to provide those referring to the specification with the ability to carry out the invention successfully and without undue experimentation.

Figure 1:
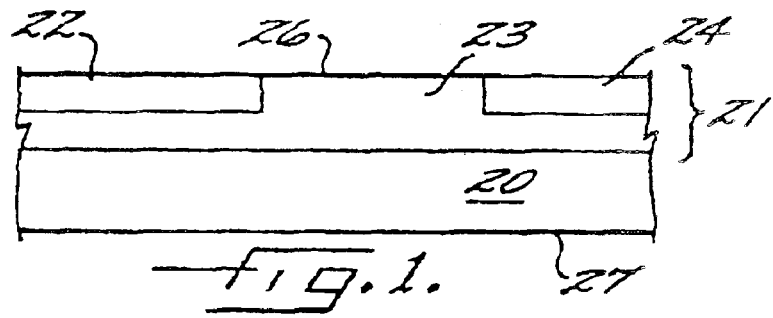
FIGS. 1 through 11 are cross-sectional diagrams illustrating the method of forming a via through a silicon carbide substrate to a device in accordance with the present invention.

FIG. 1 is a cross sectional view of a silicon carbide substrate 20 that includes a device portion indicated by the brackets 21. As stated above, the purpose of the present invention is to form a via in the SiC substrate 20, and to use the via to provide an electrical path through the substrate 20 and to the device 21 For descriptive purposes, FIGS. 1 through 11 illustrate a single via to one contact of a single device. It will nevertheless be understood that the method of the invention, and the resulting structure, are more typically applied to forming numerous vias to numerous devices that form a circuit. Certain of the method steps of the invention are, however, most clearly set forth by simplifying the illustrations.

Accordingly, FIG. 1 is meant to illustrate in broad fashion a device such as a metal-semiconductor field-effect transistor (MESFET) with an appropriate source portion 22, gate portion 23, and drain portion 24. In preferred embodiments, particularly for microwave frequency devices, the source 22, gate 23, and drain 24 are all formed in a wide band gap material such as silicon carbide, or certain of the III–V nitrides such as gallium nitride (GaN) and related binary, ternary, and tertiary III–V compounds such as AlGaN and InAlGaN.

The device is formed on a silicon carbide substrate 20 that has respective first and second surfaces 26 and 27.

Figure 2:
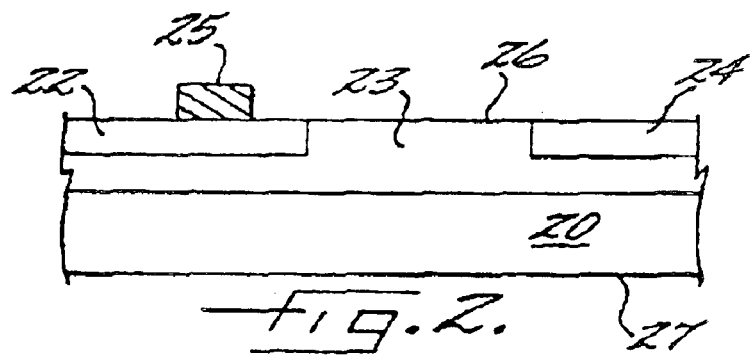

FIG. 2 illustrates the same device as FIG. 1, but with a conductive contact 25 in place on the first surface 26. Those familiar with devices such as MESFETS will immediately recognize that an exemplary device may also include a contact to the gate 23 and another to the drain 24. As just noted, however, such contacts are not shown in FIGS. 1–11 for the purpose of simplifying the presentation of the relevant information. Accordingly, FIG. 2 simply shows the conductive contact 25 to the source region 22 of the illustrated device. It will be understood that when the device is formed entirely in a single portion of silicon carbide, the entire portion can be considered the substrate 20.

Alternatively, and without departing in any manner from the invention, the substrate can also include one or more epitaxial layers ("epilayers") in which the device portion 21 is formed. In such embodiments, the first surface 26 would refer to the top surface (in the orientation of FIGS. 1–4) of the epitaxial layer. Those familiar with the growth of semiconductor materials, and particularly the growth of silicon carbide, will recognize that the use of a substrate and an epitaxial layer (or layers) even though made of the same material, provides a method of (in most circumstances) gaining an improved crystal lattice in the epitaxial layers (epilayers) as compared to the substrate. Because the use of epilayers, their method of manufacture, and the resulting structures are well understood in the art, and because the differences are minimal or non-existent with respect to the present invention, the word "substrate" will be used herein to refer to these structures, with the understanding that the structures can also include epitaxial layers.

Accordingly, FIG. 2 shows that the conductive etch stop material, which in the preferred embodiment is indium-tin-oxide ("ITO") contact 25 is placed at a predetermined position on the first surface 26 of the silicon carbide substrate 20.

Figure 3:
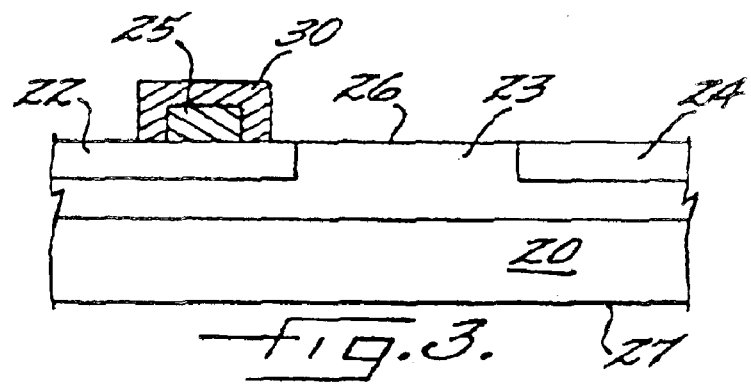

FIG. 3 illustrates that in order to provide a high quality contact for device, the indium-tin-oxide contact 25 is typically further coated with a noble metal 30 which in preferred embodiments is typically gold.

At this point, one of the particular advantages of the invention can be highlighted: the use of conductive ITO as the etch stop eliminates the need to add and remove another etch stop material before and after the etch step respectively. Instead, the ITO is simply incorporated into the device or circuit before the via is etched. Because the ITO etch stop does such double duty, fewer materials need be introduced into the process environment, and fewer process steps are required. As known those familiar with semiconductor manufacturing techniques, processes using fewer steps and fewer materials, yet producing the desired structures, are generally advantageous. Furthermore, eliminating a foreign etch stop material that would otherwise have to be both added and then removed, is particularly advantageous.

Figure 4:
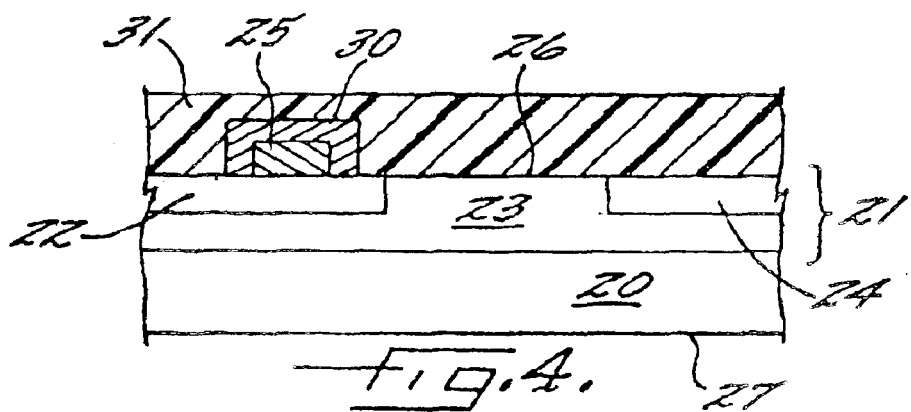

FIG. 4 illustrates that in preferred embodiments, the device, again illustrated in simplified fashion by the source 22, the gate 23, the drain 24, and the source contact 25, is covered with a protective polymer layer 31 which in preferred embodiments is a polyimide. The polyimide layer 31 protects the device underneath, and provides a leveling effect for the precursor for appropriate handling in the following manufacturing steps.

Figure 5:
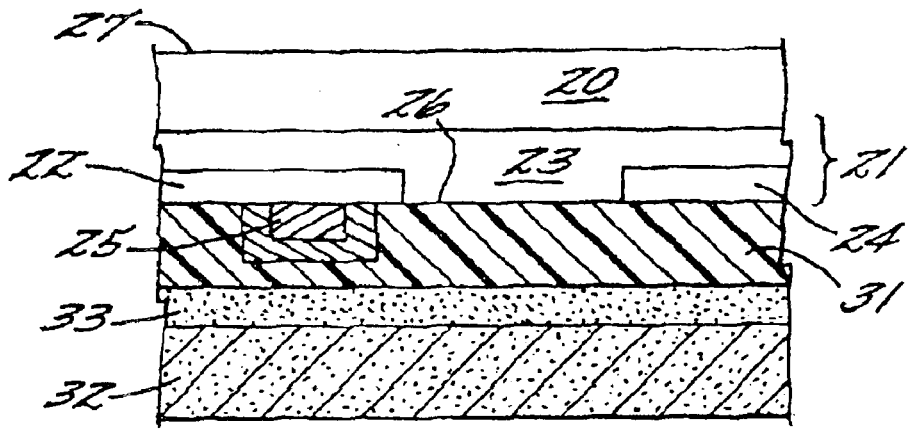

FIG. 5 illustrates that in a next step, the polymer-coated first surface 26 of the substrate 20 is mounted on a platen 32. The platen is preferably formed of silicon carbide, in this case for its mechanical and thermal properties rather than its electronic advantages. Typically, a mounting adhesive 33 is used to fix the polyimide coated surface 31 to the platen 32. The mounting adhesive can be any appropriate material that will keep the polyimide-coated device and substrate fixed to the silicon carbide platen 32 during the subsequent processing steps while both withstanding those steps and avoiding any interference with them. Such adhesives are generally well known in the art and will not be described in detail herein.

Figure 6:
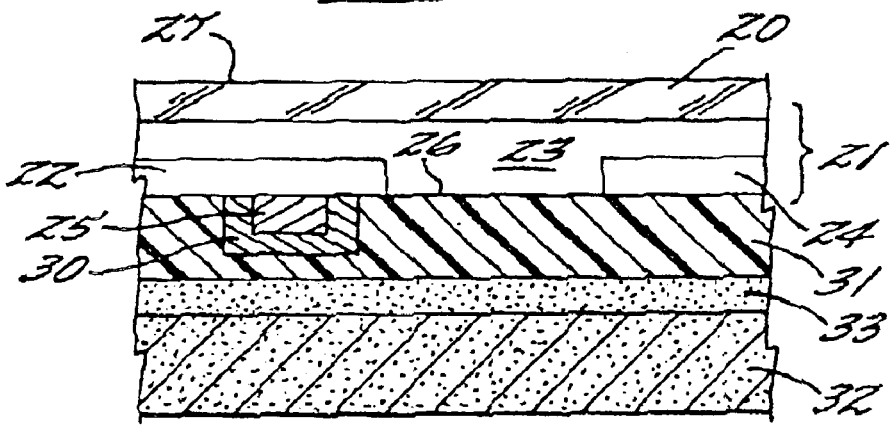

FIG. 6 illustrates that in the next step of the preferred method, the semiconductor substrate 20 is ground and polished until it is substantially transparent. The grinding and polishing are carried out for at least three reasons. First, because etching through silicon carbide is difficult under any circumstances, minimizing the thickness of the silicon carbide substrate 20 helps facilitate the overall etching process. Second, by grinding and polishing the substrate 20 until it is substantially transparent, an appropriate optical path can be defined from the second surface 27 of the substrate 20 to the metal contact 25 so that appropriate positions for the vias can be aligned and etched to the contact 25 in the desired manner, as described herein with respect to the remaining drawings. Third, the resulting thinner substrate (i.e., less mass) offers thermal advantages for the resulting device or MMIC.

According to the present invention, when etching a via the front side etch stop pads should be conductive so that the multiple layers forming the integrated circuit will be connected, thereby allowing the circuit to perform its desired function. Further, the etch mask on the backside of the sample is preferably transparent to permit optical alignment (including visual alignment) of the sample with the front side etch stop.

Figure 7:
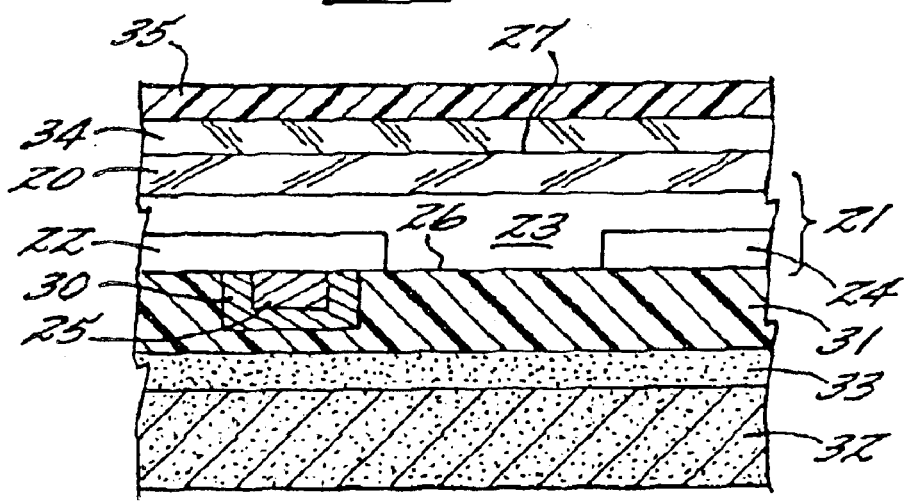

FIG. 7 illustrates that in the next steps of the preferred method of the invention, the second surface 21 of the substrate 20 is coated with a layer 34 of indium-tin-oxide (ITO). The ITO is selected and incorporated for at least two reasons. First, the ITO layer 34 can be formed to be transparent, so that the method of the invention can incorporate typical microlithography and masking techniques used in semiconductor design and manufacture. Second, and as discussed in the Experimental section to follow herein, the ITO provides a good masking material for SiC because the desired etchants discriminate as between SiC and ITO in a manner that is both desired and necessary during the etching process.

In another embodiment, the layer 34 on the substrate's second surface 21 can comprise magnesium oxide (MgO), which offers the same advantages selectivity and transparency as ITO. As known to those familiar with MgO, it can be produced in a very dense form with a very high melting point (2800° C.).

The ITO layer is then coated with an appropriate photoresist layer 35. Photoresist compounds are generally well known in the art and will not be otherwise discussed in detail herein, other than to note that an appropriate photoresist material should be compatible with deposition on the ITO layer 34, should provide an appropriate level of definition when exposed and developed, and should not otherwise interfere with the process steps that take place while the photoresist is in place.

Figure 8:
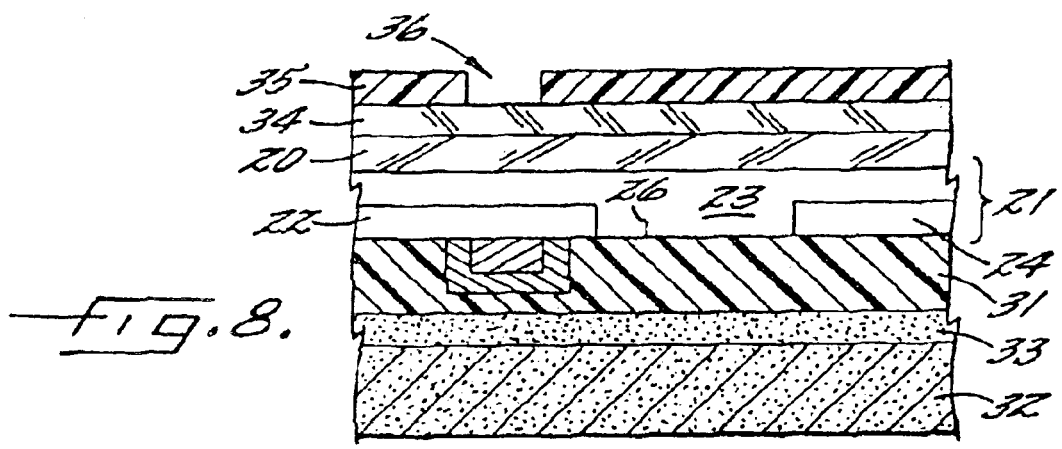
Figure 9:
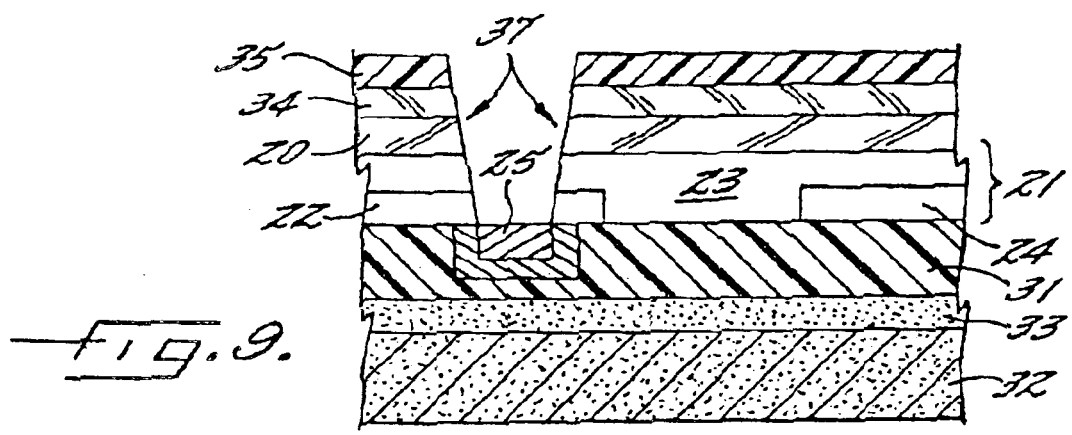

FIG. 8 illustrates the precursor structure after the photoresist 35 has been masked, exposed, and developed, steps which can otherwise be carried out in conventional fashion provided they are consistent with the remainder of the process and materials. Opening the photoresist forms a defined opening 36 in the photoresist layer 35 through which the ITO layer 34 can be appropriately opened and then, as illustrated in FIG. 9, the appropriate via 37 can be formed. In preferred embodiments of the invention, the ITO layer is etched with a reactive ion etch using with boron trichloride ($BCl_3$) chemistry.

As FIG. 9 illustrates, the via is formed by an etching step, the particulars of which will be described shortly hereinafter, but which is preferably carried out in an inductively coupled plasma, and most preferably one formed from sulfur hexafluoride ($SF_6$).

In a particularly advantageous step, the method of the invention incorporates the original conductive contact 25 as the etch stop. In this manner, the method of the invention avoids using additional steps and (often just as importantly)

additional materials to add and then remove a separate etch stop. Again, it is to be understood that although the Figures illustrate only one via, such is for the purpose of clarifying the illustrations, and the invention is advantageously used for opening multiple vias.

Figure 10:
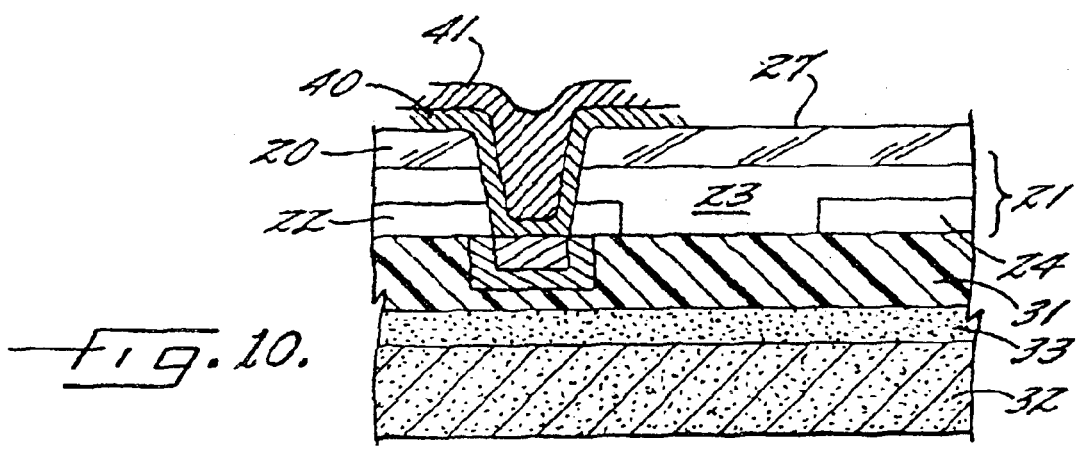
Figure 11:
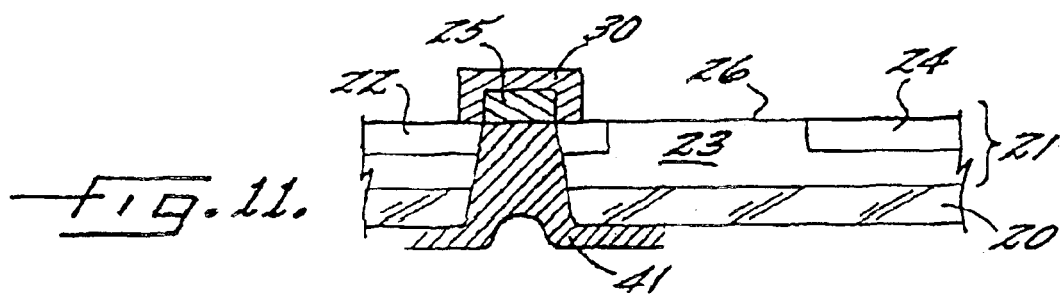

FIG. 10 illustrates that in preferred embodiments, the via is first sputter-coated with three layers of metal: titanium, platinum, and gold ("Ti/Pt/Au"), in that order, along the floor and walls of the etched trench. This coating is designated as 40 in FIG. 10. The coating 40 is then electroplated with a noble metal 41, preferably gold, to form the complete contact from the second surface 27 of the substrate 20 through to the first surface 26, and more particularly to the contact 25 which is part of the device portion 21. In preferred embodiments, the photoresist and indium-tin-oxide layer 34 and the photoresist layer 35 are both removed prior to the step of sputter coating with the Ti/Pt/Au coating 40 and the electroplating with the gold 41. The device precursor is then removed from the platen 32 and the protective polyimide layer 3/is stripped to produce the resulting device illustrated in FIG. 11.

Figure 12:
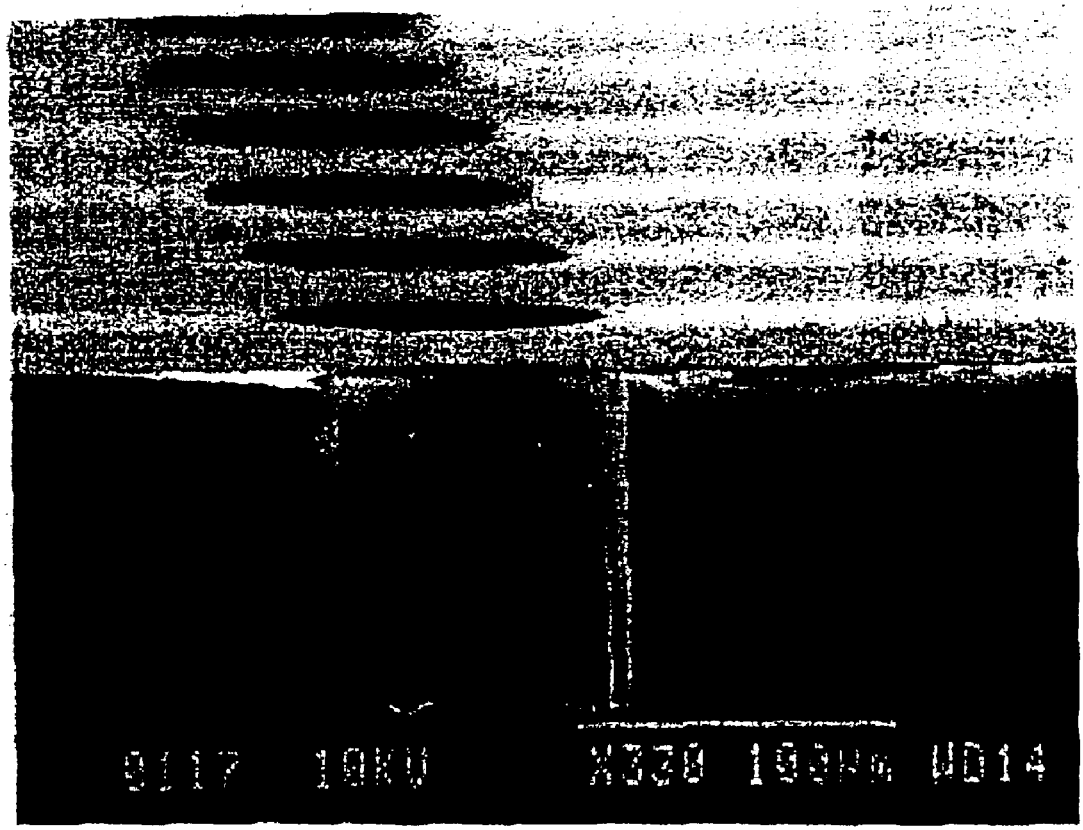
FIG. 12 is a scanning electron micrograph (SEM) of a via formed in a silicon carbide substrate according to the present invention.

FIG. 12 is an SEM micrograph of a 100 micron diameter via hole etched in a 4 mil (1000 mil=1 inch) silicon carbide wafer according to the present convention. Although FIGS. 1–11 are drawings and FIG. 12 is a photograph, by way of comparison, the top surface illustrated in FIG. 12 corresponds to the second surface 27 in the drawings. As understood by those of skill in this art, the ability to put vias of this diameter in silicon carbide substrates of this thickness, makes broadband, high frequency MMICS possible in desirable silicon carbide substrates.

The invention is a method of etching vias, typically (although not necessarily limited to) about 25 to 200 microns in diameter through a silicon carbide substrate, 100 to 200 microns thick. The inventive etch process yields an etch rate of between about 0.5 and 0.8 microns per minute ($\mu$/min.), a selectivity to the etch mask of 150, and anisotropy of 90 to 99%.

The central issue of etching vias in silicon carbide is finding an etch process which etches silicon carbide a material of high stability and high bond strength a reasonable rate (e.g., 0.5 $\mu$/min) while minimizing the erosion of the etch mask.

The invention satisfies these diametrically opposing requirements by the choice of mask material, plasma parameters, and chemistry.

In the invention, indium-tin-oxide ("ITO") is the preferred etch mask for vias in silicon carbide for several reasons. First, ITO is stable and does not etch in the fluorine chemistry that is most efficient and preferred for etching silicon carbide. Second, unlike other hard metal masks, ITO does not sputter at the ion energies that are sufficient to break silicon carbide bonds, and thus can etch silicon carbide. Third, ITO is also transparent, which allows the etch mask to be aligned through the wafer to the edge pads. Fourth, ITO is also used for the etch stop, because it is conductive and a can serve as the material on which the etch stops.

As noted above, one of the best etch masking materials for vias etches in silicon carbide is Indium-Tin-Oxide (ITO). The ITO etch mask is patterned as follows. The wafer is first blanket coated with ITO, then with photoresist. The photoresist is exposed through a mask with UV light and the exposed areas harden, thus transferring the mask pattern onto the photoresist. The photoresist acts as a mask in the subsequent etch of the ITO in the chlorine chemistry, thus transferring the pattern of the photomask onto the ITO. The ITO then acts a mask in the subsequent etch of the silicon carbide vias in fluorine chemistry.

An inductively coupled plasma (ICP) is used in the invention to generate a high density $SF_6$ plasma to etch vias in silicon carbide for several reasons. First achieving a high etch rate in the silicon carbide while minimizing the erosion of the etch mask requires a high density and low energy plasma. The use of ICP is critical for this purpose because it allows a high density plasma to be generated, and it permits the independent control of plasma density by adjusting the coil power and ion energy by adjusting the chuck power. A high coil power (600–1500 W with about 800 W preferred) is selected to maximize plasma density.

An important point of the invention is the use of a chuck power in the ICP system that maximizes the etch rate of the silicon carbide while keeping the erosion of the ITO or MgO etch mask minimal. As the chuck power is increased in an ICP system, the etch rate of the silicon carbide increases; this increase, however, is much more drastic at low chuck powers than at high chuck powers. As the chuck power is increased the erosion rate of the ITO or MgO etch mask is minimal and does not increase initially; at higher chuck powers, however, it increases rapidly. Thus, the invention incorporates the recognition that a chuck power can be selected that on one hand maximizes SiC etch rate and on the other hand maximizes the difference in the etch rates of SiC and ITO etch mask. In preferred embodiments, this chuck power level is determined to be between about 1 to 2 watts power square centimeter ($Wcm^{-2}$) presently being preferred.

Sulfur Hexafluoride ($SF_6$) chemistry is used by the invention to etch vias in silicon carbide, because it is deemed to be the most efficient of the fluoride chemistries for such purpose. The invention does not use any gas additive, as it tends to slow down the etch rate of the silicon carbide and speeds up the mask erosion by sputtering. The invention uses $SF_6$ at a pressure of 1 to 5 milliTorr, with about 3 mT being preferred. Similarly, the gas is supplied at a rate of between about 5 and 100 sccm, with about 10 sccm being preferred.

In further investigations employing the use of $SF_6$, it was determined that $SF_6$ yielded a higher SiC to ITO mask selectivity (approximately 150:1) than $NF_3$ or $CF_4$ (approximately 70:1). As discussed above, conventional methods of etching SiC included the use of $NF_3$ or $SF_6$ diluted with Ar and $CF_4/O_2$. Upon investigation, however, the addition of Ar or $O_2$ to $SF_6$ or $NF_3$ reduced the etch rate in SiC and increased mask erosion due to the lower percentage of fluorine and greater ion bombardment. Thus, the use of $SF_6$ without additional gases is preferable in achieving the increased etch rate and high selectivity with respect to an ITO mask of the present invention.

The etch rate of a via can be increased by raising the temperature of the substrate or thin film applied thereon. Elevations in temperature may be achieved by halting the flow of helium to the backside of the sample, which serves to cool the sample. Otherwise, the backside pressure is maintained at between about 1 and 10 torr. The chemical reactions affecting the etch rate (e.g., breaking of molecular bonds) can also be increased by increasing the gas flow and chamber pressure.

An increase in the chemical reactions affecting the via etch results in an increased lateral etch and, thus, sidewall slope of the via. The increase in the chemical reactions also leads to an increase in the etch rate and erosion of the ITO mask. Further, spiking and surface imperfections may result from the enhanced chemical reactions.

As exemplified by the referenced cited in the Background, the equipment and processes used to generate inductively coupled plasmas are generally well-known and well-understood in this art. Accordingly, the techniques described herein can be carried out by those of ordinary skill in this art, and without undue experimentation.

Experimental:

In preferred embodiments, the present invention also comprises a method of dry etching a via in SiC using sulfur hexafluoride chemistry in an inductively coupled plasma (ICP). In a particular embodiment of the invention, the dry etching was conducted in a Model 790 ICP system manufactured by Plasma-Therm Incorporated.

In this system, the wafer is placed on a He-cooled chuck in the process chamber, the wafer is clamped and subsequently the process chamber is evacuated to $10^{-5}$ Torr with a turbo and mechanical pump. Five to twenty cubic centimeter per minute electronic grade sulfur hexafluoride is injected into the process chamber and a butterfly valve above the turbo pump is throttled to achieve the operating pressure of 2 to 5 mT. Subsequently, power is applied to generate a plasma. This system uses two radio frequency (RF) power sources. One is connected to the chuck and is used to control energies of ions reaching the substrate and is set between 1 to 2 $W/cm^2$. The second RF source is connected to a three turn inductor coil wrapped around the ceramic process chamber. The second RF source provides the main plasma generating power, controls plasma densities and is set between 800 to 1200 W.

Prior to etching the via, the SiC substrate is coated with ITO, then patterned with photoresist using standard photolithography. The ITO is then dry etched in chlorine chemistry in which the photoresist is the etch mask. Vias are subsequently etched in SiC in fluorine chemistry in which the ITO is the etch mask. The via dry etch process is highly anisotropic, with SiC etch rate of 0.5 to 0.8 micron/min, and selectivity to the etch mask of 100 to 150.

In the specification, there have been disclosed typical embodiments of the invention, and, although specific terms have been employed, they have been used in a generic and descriptive sense only and not for purposes of limitation, the scope of the invention being set forth in the following claims.

What is claimed is:

1. A semiconductor device for incorporation into an integrated circuit that eliminates wire bonding for electrical connection, comprising:
    a silicon carbide substrate having respective first and second surfaces;
    at least one epitaxial layer comprising a Group III nitride on said first surface of said silicon carbide substrate, said at least one epitaxial layer comprising a lower surface in contact with said silicon carbide substrate and an uppermost surface for fabricating semiconductor device components thereon;
    a conductive via extending entirely through said silicon carbide substrate and said at least one epitaxial layer;
    a conductive contact over said via on said uppermost surface of said at least one epitaxial layer; and
    a semiconductor device formed in said at least one epitaxial layer and for which said conductive contact comprises an electrical contact.

2. A semiconductor device according to claim 1 wherein said conductive via is metallized.

3. A semiconductor device according to claim 1 wherein at least some portions of said silicon carbide substrate are semi-insulating.

4. A semiconductor device according to claim 1 wherein said conductive contact comprises indium-tin-oxide.

5. A semiconductor device according to claim 4 wherein said indium-tin-oxide contact is coated with a noble metal.

6. A semiconductor device according to claim 1 wherein said Group III nitride is selected from the group consisting of AlN, GaN, InGaN, AlGaN, and InAlGaN.

7. A semiconductor device according to claim 1 wherein said semiconductor device comprises a plurality of epitaxial layers.

8. A semiconductor device according to claim 7 further comprising two or more vias extending entirely through said silicon carbide substrate and through said plurality of epitaxial layers, with each via covered at said uppermost surface of said epitaxial layers with a conductive contact that forms an electrical contact to said semiconductor device fabricated in said epitaxial layers.

9. A semiconductor device for incorporation into an integrated circuit, comprising:
    a silicon carbide substrate;
    at least one epitaxial layer on said substrate, said at least one epitaxial layer comprising semiconductor material selected from the group consisting of silicon carbide and a Group III nitride, said at least one epitaxial layer further comprising a lower surface in contact with said silicon carbide substrate and an uppermost surface for fabricating semiconductor device components thereon;
    respective contacts on said uppermost surface for defining source, gate, and drain regions in said epitaxial layer,
    at least one conductive via extending through said substrate and through said at least one epitaxial layer, each of said conductive vias terminating on one of said source, gate, or drain contacts, thereby providing an electrically conductive path through said substrate and said at least one epitaxial layer to said source, gate, or drain contact.

10. A semiconductor device according to claim 9 comprising a plurality of epitaxial layers.

11. A semiconductor device according to claim 9 wherein said conductive via is metallized.

12. A semiconductor device according to claim 9 wherein said semiconductor device is a field effect transistor.

13. A semiconductor device according to claim 9 wherein at least some portions of said silicon carbide substrate are semi-insulating.

* * * * *